(12) United States Patent
Akinmade-Yusuff et al.

(10) Patent No.: US 8,138,093 B2
(45) Date of Patent: Mar. 20, 2012

(54) METHOD FOR FORMING TRENCHES HAVING DIFFERENT WIDTHS AND THE SAME DEPTH

(75) Inventors: Hakeem B. S. Akinmade-Yusuff, Hopewell Junction, NY (US); Samuel S. Choi, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 12/539,930

(22) Filed: Aug. 12, 2009

(65) Prior Publication Data

US 2011/0039413 A1 Feb. 17, 2011

(51) Int. Cl.
*H01L 21/311* (2006.01)

(52) U.S. Cl. ........ 438/702; 438/700; 438/701; 438/427; 257/E21.548; 257/E21.218; 257/622; 257/623

(58) Field of Classification Search ................ 438/700, 438/702, 701, 427; 257/618, 622, 623, E21.282, 257/E21.218, E21.284, E21.548
See application file for complete search history.

(56) References Cited

U.S. PATENT DOCUMENTS

| | | | |
|---|---|---|---|
| 707,112 A | 8/1902 | Horrocks | |
| 6,194,128 B1 | 2/2001 | Tao et al. | |
| 6,624,053 B2 | 9/2003 | Passemard | |
| 6,828,247 B2 | 12/2004 | Nakagawa et al. | |
| 6,875,688 B1 | 4/2005 | America et al. | |
| 7,057,287 B2 | 6/2006 | Kumar et al. | |
| 7,084,479 B2 | 8/2006 | Chen et al. | |
| 7,091,612 B2 | 8/2006 | Kumar et al. | |
| 7,192,877 B2 | 3/2007 | Ali | |
| 7,196,014 B2 | 3/2007 | Dalton et al. | |
| 7,226,853 B2 | 6/2007 | Bekiaris et al. | |
| 7,253,098 B2 | 8/2007 | Chen et al. | |
| 7,338,895 B2 | 3/2008 | Kumar et al. | |
| 7,352,064 B2 | 4/2008 | Fuller et al. | |
| 7,358,182 B2 | 4/2008 | Baks et al. | |
| 7,371,461 B2 | 5/2008 | Fuller et al. | |
| 2001/0030169 A1 | 10/2001 | Kitagawa et al. | |
| 2005/0221579 A1* | 10/2005 | Matsumoto | 438/424 |
| 2006/0211214 A1* | 9/2006 | Nagao | 438/424 |
| 2006/0226121 A1* | 10/2006 | Aoi | 216/67 |
| 2007/0218679 A1 | 9/2007 | Schneider et al. | |
| 2008/0102638 A1* | 5/2008 | Naik et al. | 438/702 |
| 2008/0171433 A1 | 7/2008 | Huang et al. | |
| 2009/0093114 A1* | 4/2009 | Burns et al. | 438/637 |

FOREIGN PATENT DOCUMENTS

WO WO 02/07203 A2 1/2002

* cited by examiner

*Primary Examiner* — Julio J Maldonado
*Assistant Examiner* — Maria Ligai
(74) *Attorney, Agent, or Firm* — Scully, Scott, Murphy & Presser, P.C.; Wenjie Li

(57) ABSTRACT

A lithographic material stack including a photo-resist and an organic planarizing layer is combined with an etch process that generates etch residues over a wide region from sidewalls of etched regions. By selecting the etch chemistry that produces deposition of etch residues from the organic planarizing layer over a wide region, the etch residue generated at the sidewalls of the wide trench is deposited over the entire bottom surface of the wide trench. An etch residue portion remains at the bottom surface of the wide trench when the organic planarizing layer is etched through in the first trench region. The etch residue portion is employed in the next step of the etch process to retard the etch rate in the wide trench, thereby producing the same depth for all trenches in the material layer into which the pattern of the lithographic material stack is transferred.

20 Claims, 10 Drawing Sheets

METHOD FOR FORMING TRENCHES HAVING DIFFERENT WIDTHS AND THE SAME DEPTH

BACKGROUND

The present invention in one embodiment relates to semiconductor processing methods, and particularly to methods for forming trenches having different widths and the same depth.

Trenches are widely used in semiconductor technology to form patterned structures. For example, contact vias and interconnect lines in metal interconnect structures are formed first by forming trenches in a dielectric material layer that provides electrical insulation among conductive structures, followed by filling the trenches with a conductive material to form additional conductive structures. Further, shallow trench isolation structures are formed by forming trenches in a semiconductor substrate, followed by filling the trenches with a dielectric material to provide electrical isolation between adjoining semiconductor regions.

In general, trenches refer to any recessed structure from a top surface, which is typically planar. The depth of each trench is typically affected by the surrounding structures around each recessed structure because of an inherent processing feature of an etch process employed to form the trenches. Specifically, a reactive ion etch (RIE) which is typically employed to form trenches has the undesirable feature of pattern factor dependency of the profile and the depth of the trenches. This phenomenon is also known as a RIE lag. The pattern factor dependency arises due to the nature of the reactive ion etch, which employs a finite supply of reactive ions, and consequently, limits the reaction rate by the supply of the reactant. Thus, a trench surrounded by a large unpatterned region (non-etched region) typically has a greater depth than a trench surrounded by a patterned region (etched region).

The pattern factor dependency of the depth of trenches is typically amplified by the etch residues, which may be polymers from a photoresist employed to form a pattern over the material layer in which the trenches are formed. As the etch residue is deposited on, or flows down onto, the sidewalls of the trenches, the etch residue tends to prevent the etching of the portions of the material layer covered by the etch residue.

Thus, in the prior art, the isolated trench extends to a different depth than the nested trenches. Typically, wide isolated trenches extend to deeper depth than nested trenches. The conductive structure formed by filling the isolated trench, therefore, has a greater capacitive coupling with the metal interconnect structures as well as greater probability of having an electrical short with the metal interconnect structures. The increase in the capacitive coupling increases the RC delay time for the conductive structure, adversely impacting the performance of a semiconductor chip. The increase in the probability of an electrical short reduces the chip yield, lowering the productivity of the manufacturing process. Thus, the conventional reactive etch process provides adverse effects in terms of performance and productivity through the structural characteristics.

BRIEF SUMMARY

In one embodiment of the present invention, methods of forming trenches having different widths and the same depth are provided. The method described herein may be employed to reduce parasitic capacitive coupling of a metal interconnect structure, to reduce the probability of electrical shorts in a metal interconnect structure, to reduce variation of the depth of shallow trench isolation structures, and/or to provide multiple structures having different widths and/or pattern factor and the same width.

In one embodiment of the present invention, a lithographic material stack including a photoresist and an organic planarizing layer is combined with an etch process that generates etch residues over a wide region from sidewalls of etched regions, which includes a first trench region including a narrow trench and having a high pattern factor and a second trench region including a wide trench and having a low pattern factor. By selecting the etch chemistry that produces deposition of etch residues from the organic planarizing layer over a wide region, the etch residue generated at the sidewalls of the wide trench is deposited over the entire bottom surface of the wide trench. In addition, polymers generated by the plasma of the etch process add to the film formation. Because the wide trench is located in a low pattern factor region, more reactants are available in the second trench region, thereby generating more etch residues at the bottom surface of the wide trench compared to the bottom surface of the narrow trench. An etch residue portion remains at the bottom surface of the wide trench when the organic planarizing layer is etched through in the first trench region. The etch residue portion is employed in the next step of the etch process to retard the etch rate in the wide trench, thereby producing the same depth for all trenches in the material layer into which the pattern of the lithographic material stack is transferred.

According to one embodiment of the present invention, a method of forming a patterned structure is provided, which includes: forming a material stack including a photoresist layer and an organic planarizing layer including an organic planarizing material over at least one underlying layer; forming a first trench in a first region of the organic planarizing layer and a second trench in a second region of the material stack by etching the organic planarizing layer, wherein two sidewalls of the first trench are separated by a first width and two sidewalls of the second trench are separated by a second width that is greater than the first width; and completely removing the organic planarizing material from the first trench to expose a top surface of the at least one underlying layer across an entirety of a bottom surface of the first trench, while concurrently forming an etch residue portion including the organic planarizing material on a bottom surface of the second trench.

In one embodiment, the method further includes extending the first trench and the second trench into a material layer within the at least one underlying layer by an anisotropic etch.

In another embodiment, the first trench has a first depth and the second trench has a second depth after the extending, the second depth is the same as the first depth after the extending, and the first depth is a vertical distance from a planar top surface of the material layer to a bottom surface of the first trench after the extending and the second depth is a vertical distance from the planar top surface of the material layer to a bottom surface of the second trench after the extending.

DETAILED DESCRIPTION

Figure 1:
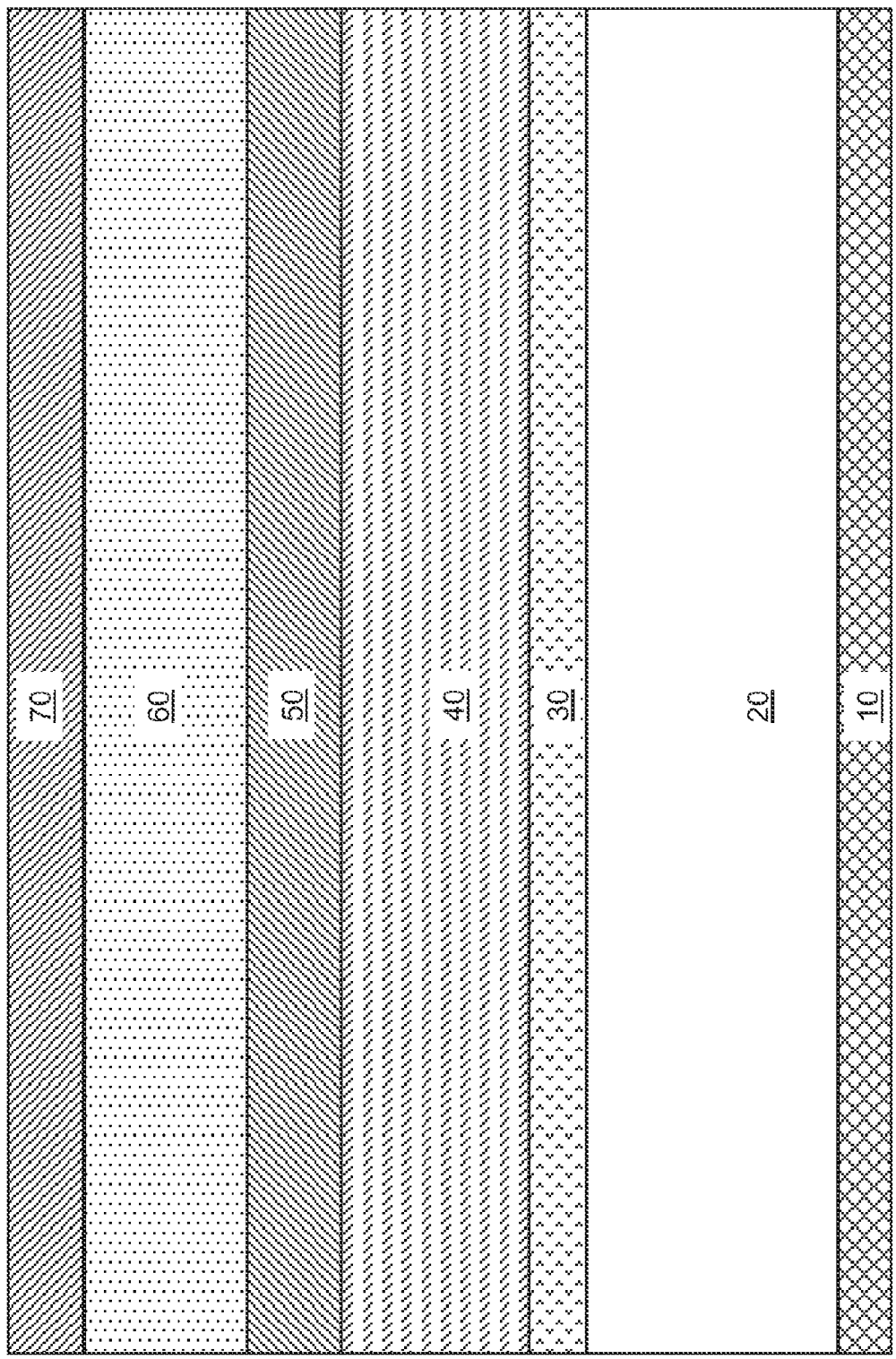
FIG. 1 is a vertical cross-sectional view of a first exemplary structure before forming a lithographic pattern according to a first embodiment of the present invention.

As stated above, the present invention relates to methods for forming trenches having different widths and the same depth, which are now described in detail with accompanying figures. Throughout the drawings, the same reference numerals or letters are used to designate like or equivalent elements. The drawings are not necessarily drawn to scale.

Referring to FIG. 1, a first exemplary structure according to a first embodiment of the present invention includes at least one underlying layer, which may be a vertical stack including, from bottom to top, a material layer 20 and a dielectric hard mask layer 30 having a dielectric constant greater than 2.7. The at least one underlying layer (20, 30) is typically located on a substrate (not shown). The substrate may include a semiconductor material, an insulator material, a conductive material, or a combination thereof. In case the substrate includes a semiconductor material, the substrate may include a bulk semiconductor substrate, a semiconductor-on-insulator (SOI) substrate, or a hybrid substrate having different surface crystallographic orientations and including, but not limited to, a bulk portion and/or an SOI portion. The substrate may include at least one semiconductor device such as a field effect transistor (FET), a diode, a resistor, a capacitor, an inductor, and/or an integrated circuit (IC) including a combination of various semiconductor devices. The substrate may, or may not, include at least one metal interconnect structure such as a dielectric layer embedding metal lines, metal vias, or a combination thereof. In case the substrate includes at least one metal interconnect structure, a dielectric cap layer 10 may be interposed between the at least one metal interconnect structure and the material layer 20.

The material layer 20 may include a semiconductor material, a dielectric material, a conductive material, or a combination thereof. For example, the material layer 20 may include at least one dielectric material selected from a low dielectric constant (low-k) material layer having a dielectric constant less than 2.7 (in general, any dielectric material used for interconnect technology such as FTEOS, TEOS, OMCTS, and the aforementioned low-k materials), a silicon oxide, a silicon nitride, a silicon oxynitride, and a doped silicate glass. The thickness of the material layer 20 may be from 50 nm to 1,000 nm, and preferably from 75 nm to 400 nm, although lesser and greater thicknesses are also contemplated herein.

The dielectric hard mask layer 30 is a layer of a dielectric material that is employed as a hard mask. The dielectric hard mask layer 30 may be employed as a stopping layer in a subsequent planarization of a conductive material in trenches formed in the material layer 20. The dielectric hard mask layer 30 may be a silicon nitride layer, a silicon oxide layer, a silicon oxynitride layer, or a combination thereof. The thickness of the dielectric hard mask layer 30 may be from 5 nm to 50 nm, and preferably from 7.5 nm to 30 nm, although lesser and greater thicknesses are also contemplated herein.

A material stack including at least a photoresist layer 60 and an organic planarizing layer 40 is formed on the top surface of the at least one underlying layer (20, 30). The material stack may include, from bottom to top, the organic planarizing layer 40, a bottom anti-reflective coating (BARC) layer 50, the photoresist layer 60, and a top anti-reflective coating (TARC) layer 70. The top anti-reflective coating (TARC) layer 70 is optional, i.e., may, or may not, be present. The material stack (40, 50, 60, 70) may be formed, for example, in a lithographic stepper including multiple spin coating stations and at least one curing chamber so that the material stack (40, 50, 60, 70) may be formed within the lithographic stepper in a single processing step. Alternately, multiple lithographic steppers and/or dedicated curing tools may be employed to form the material stack (40, 50, 60, 70).

The organic planarizing layer 40 includes an organic planarizing material. The organic planarizing material may be an organic polymer including C, H, and N. The organic planarizing material is capable of generating etch residues during a reactive ion etch process that is re-deposited on unetched portions of the organic planarizing layer. Preferably, the organic planarizing material is free of fluorine (F). Preferably, the organic planarizing material is free of silicon (Si). As defined herein, a material is free of an atomic element when the level of the atomic element in the material is at or below a trace level detectable with analytic methods available in the art. The organic planarizing layer 40 may be free of Si and F. Non-limiting examples of the organic planarizing material include JSR HM8006, JSR HM8014, AZ UM10M2, Shin Etsu ODL 102, other similar commercially available materials from such vendors such as JSR, TOK, Sumitomo, Rohm & Haas. The thickness of the organic planarizing layer 40 may be from 60 nm to 600 nm, and preferably from 100 nm to 300 nm, although lesser and greater thicknesses are also contemplated herein.

The BARC layer 50 may be formed by any conventional method of forming a lithographic material layer, which may be, for example, spin coating. The BARC layer 50 includes a material that reduces light reflection at the wavelengths of illumination on the photoresist layer 60. The BARC layer 50 typically includes an organic material including a light absorber material and a polymer material. For example, the BARC layer 50 may include a crosslinking agent component substituted by a hydroxylalkyl group or an alkoxyalkyl group, a benzophenone-based, diphenylsulfone-based or diphenylsulfoxide-based dye component and an acrylic resin. The BARC layer 50 may also be a Si-containing anti-reflection layer, i.e., include silicon in the composition of the material. The composition of the BARC layer 50 may be optimized depending on the composition of the photoresist layer 60. The thickness of the BARC layer 50 may be from 20 nm to 200 nm, and typically from 40 nm to 120 nm, although lesser and greater thicknesses are also contemplated herein. The presence of the BARC layer 50 is optional, and embodiments in which the BARC layer 50 is omitted are also contemplated herein. Further, the entirety of the BARC layer 50 may consist of the same material, or a plurality of layers having different compositions.

The photoresist layer 60 is formed either directly on the top surface of the BARC layer 50 or on the top surface of the organic planarizing layer 40. The photoresist layer 60 may be formed, for example, by spin coating. The photoresist layer 60 includes a material that is photosensitive at a wavelength range. The photoresist layer 60 may include a deep ultraviolet (DUV) photoresist, a mid-ultraviolet (MUV) photoresist, an extreme ultraviolet (EUV) photoresist, or an electron beam (e-beam) photoresist. The material of the photoresist layer 60 reacts to illumination and is chemically changed, for example, by cross-linking, in the wavelength range within which the photoresist layer 60 is photosensitive. The thickness of the photoresist layer 60 may be from 30 nm to 600 nm, and typically from 60 nm to 300 nm, although lesser and greater thicknesses region also contemplated herein.

The TARC layer 70 may be formed by any conventional method of forming a lithographic material layer, which may be, for example, spin coating. The TARC layer 70 includes a material that reduces light reflection at the wavelengths of illumination on the photoresist layer 60. The TARC layer 70 typically includes an organic material including a light absorber material and a polymer material. The TARC layer 70 includes a photosensitive material that may be removed from lithographically exposed areas during development. Non-limiting examples of the material that may be employed for the TARC layer 70 include NFC-445, JSR TCX-014, AZ Aquatar series and other similar and commercially available products from optical lithography chemical vendors such as Shin Etsu, TOK, and Rohm & Haas. Like the BARC layer 50, the composition of the BARC layer 70 may be optimized depending on the composition of the photoresist layer 60. The thickness of the TARC layer 70 may be from 20 nm to 240 nm, and typically from 45 nm to 180 nm, although lesser and greater thicknesses are also contemplated herein. The presence of the TARC layer 70 is optional, and embodiments in which the TARC layer 70 is omitted are also contemplated herein.

Figure 2:
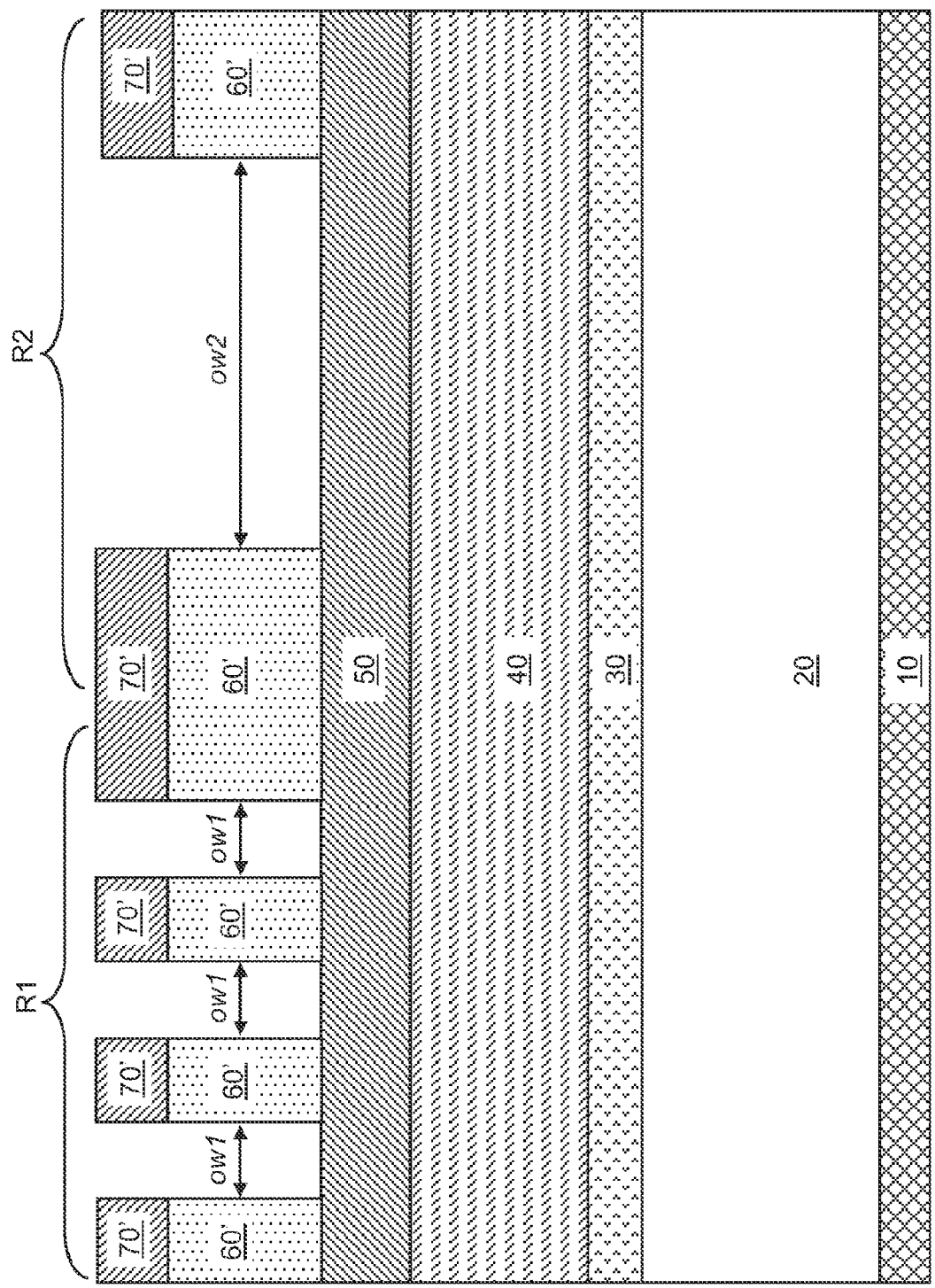
FIG. 2 is a vertical cross-sectional view of the first exemplary structure after lithographic patterning of a photoresist layer according to the first embodiment of the present invention.

Referring to FIG. 2, the photoresist layer 60 is patterned to form a patterned photoresist layer 60' by lithographic methods, e.g., by a combination of lithographic exposure and development. If the TARC layer 70 is present over the photoresist layer 60 prior according to the exposure and development, the TARC layer 70 is also patterned to form a patterned TARC layer 70'. The stack of the patterned photoresist layer 60' and the patterned TARC layer 70' includes a first region R1 and a second region R2.

The first region R1 includes at least one first opening each having a first opening width ow1. A first opening is an opening between two adjacent sidewalls around an exposed top surface of the BARC layer 50 in the first region R1. The first opening width ow1 is defined as a lateral distance between a pair of sidewalls of the stack of the patterned photoresist layer 60' and the patterned TARC layer 70' around the first opening. The pair of the sidewalls around the first opening may be parallel to each other and have a constant separation distance, which is the first opening width ow1, throughout the first opening.

The first region R1 may include a plurality of first openings having the first opening width ow1. In case a plurality of first openings have a periodicity in at least one direction, the plurality of first openings form a nested pattern, i.e., a periodic repetition of a unit pattern in at least one direction. Such nested patterns include a line-space nested pattern, which includes a plurality of first openings in which each of the first openings is a linear space having a constant width, i.e, the first opening width ow1, between neighboring sidewalls of the stack of the patterned photoresist layer 60' and the patterned TARC layer 70' around each first opening.

The first opening width ow1 may be a critical dimension, i.e., the smallest dimension that may be printed employing conventional lithographic techniques and available lithographic tools. Alternately, the first opening width ow1 may greater than the critical dimension Because the capabilities of available lithographic tools change in time, the critical dimension also changes in time. However, it is well established that the critical dimension may be defined at any point in time employing the capabilities of the best available lithography tools. As of the filing date of this application, the critical dimension is about 32 nm, and is expected to decrease in the future. In case the plurality of first openings forms a nested pattern, the pitch of the pattern may also be a critical pitch, i.e., the smallest pitch that may be formed by conventional lithographic techniques and available lithographic tools. Alternately, the pitch of the pattern may be greater than the critical pitch.

The second region R2 includes a second opening having a second opening width ow2. The second opening is an opening between two adjacent sidewalls around an exposed top surface of the BARC layer 50 in the second region R1. The second opening width ow2 is defined as a lateral distance between a pair of sidewalls of the stack of the patterned photoresist layer 60' and the patterned TARC layer 70' around the second opening. The pair of the sidewalls around the second opening may be parallel to each other and have a constant separation distance, which is the second opening width ow2, throughout the first opening.

The second opening width ow2 is greater than the first opening width ow1. For example, the ratio between the second opening width ow2 to the first opening width ow1 is greater than 2, and may be from 10 to 1,000 in some cases. The second area R2 may, or may not, have an additional opening. In some cases, the first region R1 has a greater pattern factor than the second region R2. In some other cases, the first region r1 has a lesser pattern factor than the second region. A pattern factor is the ratio of the total area of openings in a region to the total area of the region. Typically, the sidewalls of the patterned photoresist layer 60' and the patterned TARC layer 70' are vertical.

Figure 3:
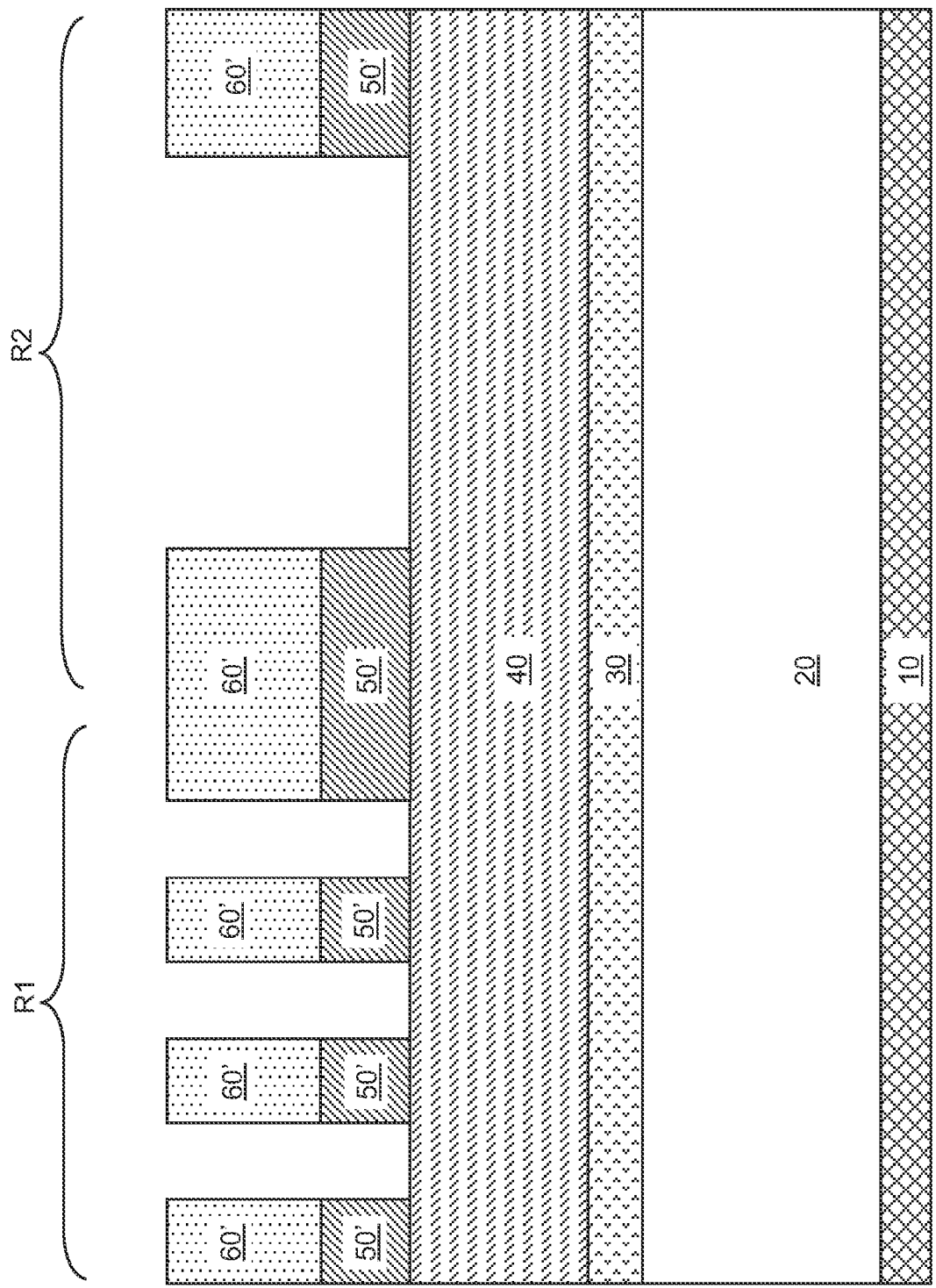
FIG. 3 is a vertical cross-sectional view of the first exemplary structure after a first anisotropic etch that etches a bottom anti-reflective coating layer according to the first embodiment of the present invention.

Referring to FIG. 3, the pattern in the stack of the patterned photoresist layer 60' and the patterned TARC layer 70' is transferred into the BARC layer 50 by a first anisotropic etch, which is typically a reactive ion etch. The reactant gas employed for the first anisotropic etch may include a fluorocarbon. In a demonstration of the first anisotropic etch, 180 sccm of $CF_4$ gas was employed in a process chamber maintained at 100 mTorr and supplied with an RF (radiofrequency) power for a reactive ion etch. A top surface of the organic planarizing layer 40 is exposed within each of the first openings in the first region R1 and the second opening in the second region R2. Typically, the patterned TARC layer 70' is consumed during the first anisotropic etch. Typically, the sidewalls of the patterned photoresist layer 60' and the patterned BARC layer 50' are vertical.

Figure 4:
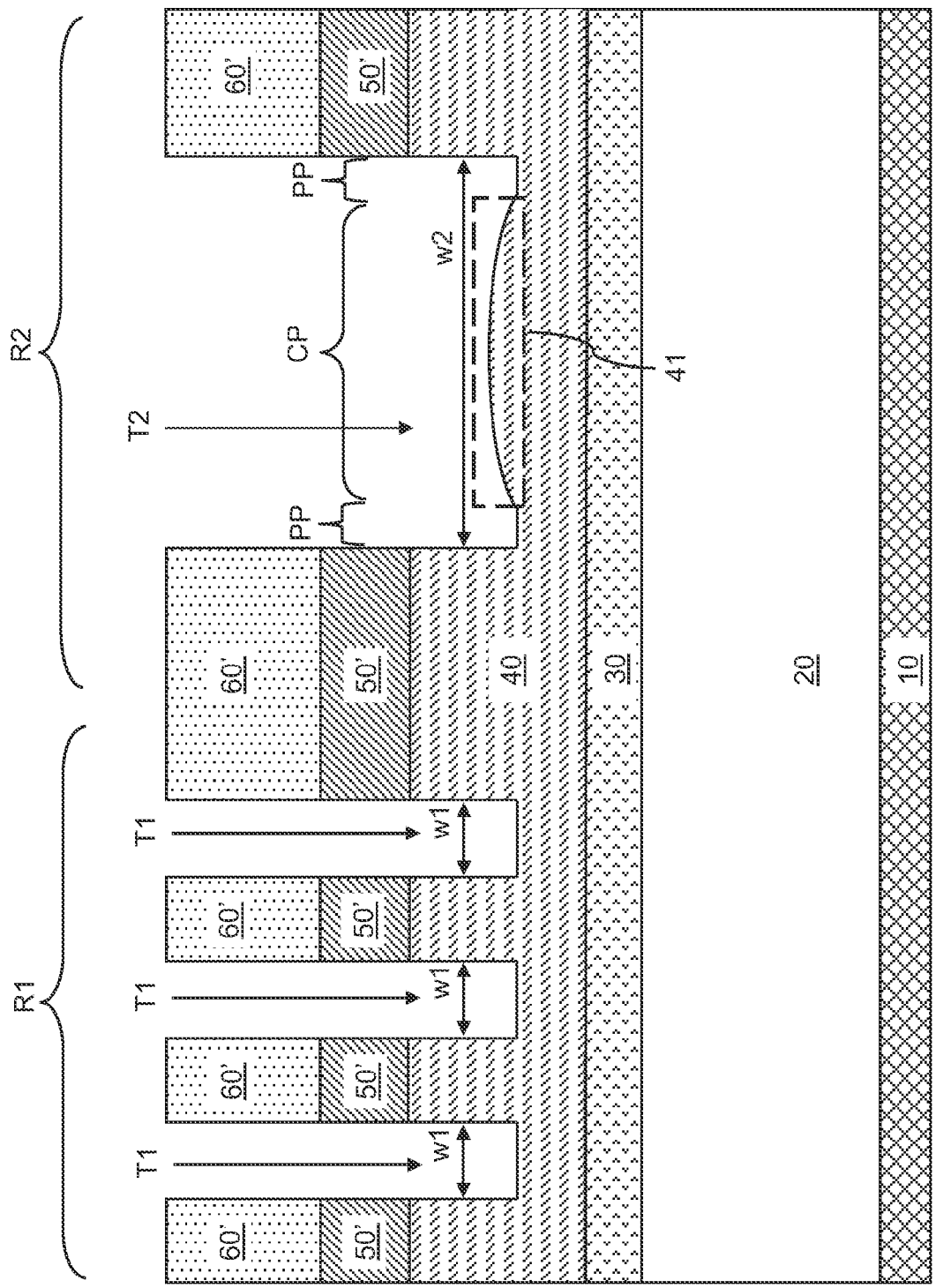
FIG. 4 is a vertical cross-sectional view of the first exemplary structure during a second anisotropic etch that etches an organic planarizing layer according to the first embodiment of the present invention.

Referring to FIG. 4, a vertical cross-sectional view of the first exemplary structure during a second anisotropic etch, which is performed to anisotropically etch the exposed portions of the organic planarizing layer 40, is shown. The patterned photoresist layer 60' is employed as an etch mask for the etching of the organic planarizing layer 40. The second anisotropic etch is a reactive ion etch that is performed in a process chamber, which may be the same as, or different from, the process chamber employed for the first anisotropic etch. Preferably, the second anisotropic etch is performed in the same process chamber as the first anisotropic etch.

At least one first trench T1 is formed in the first region R1 of the organic planarizing layer 40 and a second trench T2 is formed in the second region R2 of the organic planarizing layer 40 by the second anisotropic etch. Two sidewalls of each first trench T1 is separated by a first width w1, which may be substantially the same as the first opening width ow1 in FIG. 2. Two sidewalls of the second trench T2 is separated by a second width w2, which may be substantially the same as the second opening width ow2 in FIG. 2.

The etch chemistry in the second anisotropic etch is selected to produce etch residues from the organic planarizing layer 40 in significant quantities. This feature is the opposite of a feature of conventional reactive ion etch processes, which require minimizing etch residues, which are byproducts of a reactive ion etch, in order to reduce maintenance frequency for the process chamber used for such conventional reactive ion etch processes. The generation of etch residues in the at least one first trench T1 and the second trench T2 tends to reduce the etch rate of the second anisotropic etch. However, a micro-trenching effect, which enhances the etch rate during a reactive ion etch in the vicinity of a sidewall, tends to compensate for the reduction in the etch rate in the vicinity of the exposed sidewalls of the organic planarizing layer 40.

Because each of the at least one first trench T1 is narrow, i.e., the first width w1 is at or close to the critical dimension, the vicinity of the sidewalls of the at least one first trench T1 includes all of the exposed areas of the at least one first trench T1. Therefore, the etch rate of the organic planarizing layer 40 is enhanced through the micro-trenching effect in all of the areas of the at least one first trench T1 in the first region R1.

In the second trench T2 in the second region R2, however, the second width w2 is greater than w1, and is typically greater than the distance to which the micro-trenching effect extends. In other words, the micro-trenching effect in the second trench R2 is limited to a peripheral portion PP, which is defined as the area of the bottom surface of the second trench T2 within which the micro-trenching effect keeps the etch rate of the organic planarizing layer 40 comparable with the etch rate in the at least one first trench T1. In the center portion CP of the second trench T2, the reduction of the etch rate due to the prolific generation of the etch residue is effective and the micro-trenching effect is not present. The combination of these two factors provides a reduced etch rate for the organic planarizing layer 40 in the center portion CP of the second trench T2.

As a consequence, a bump portion 41 having the same material as the organic planarizing layer 40 protrudes upward within the center portion CP of the second trench T2. The bump portion 41 is a portion of the organic planarizing layer 40, and is of integral construction with the rest of the organic planarizing layer 40. Typically, the width of the peripheral portion PP, which corresponds to the shortest distance between an outer edge of the bump portion 41 and the sidewalls of the second trench T2, is at least one half of the first width w1, and may be comparable to the first width w1.

The etch chemistry for the second anisotropic etch may employ, but is not limited to, an etch chemistry including a mixture of $H_2$ and $N_2$. In this case, a mixture of etchant gas including $H_2$ and $N_2$ is introduced into the process chamber during the reactive ion etch, i.e., the second anisotropic etch. $H_2$ is flown at a first flow rate and $N_2$ is flown at a second flow rate into the process chamber. The first flow rate is set to be greater than the second flow rate in order to generate a significant quantity of etch residues from the organic planarizing layer 40 and to insure formation of the bump portion 41. Setting the ratio of the first flow rate to the second flow rate at a value less than 1.0 results in insufficient generation of the etch residue for the purposes of the present invention. While generation of less etch residue may be preferred in conventional reactive etch processes, generation of sufficient etch residue is employed in an embodiment of the present invention. Setting the ratio of the first flow rate to the second flow rate at a value less than 1.0 provides insufficient quantity of etch residue for the purpose of this embodiment of the present invention.

Therefore, the ratio between the first flow rate and the second flow rate is set at a value greater than 1:1 and less than 10:1, and preferably at a value between 1.5:1 and 3:1. The first flow rate may be from 10 sccm to 2,000 sccm, and preferably from 30 sccm to 600 sccm, although lesser and greater flow rates are contemplated depending on the size of the process chamber. The pressure in the process chamber during the reactive ion etch of the second anisotropic etch may be from 5 mTorr to 200 mTorr, and is preferably from 10 mTorr to 100 mTorr, although lesser and greater pressures are also contemplated provided that reactive ions may be generated in the process chamber.

In one case, the etchant gas consists essentially of $H_2$ and $N_2$ and no other gas is flown into the process chamber during the reactive ion etch than the mixture of etchant gas. In another case, the etchant gas consists essentially of $H_2$ and $N_2$ and only an inert gas selected from He, Ne, Ar, Kr, Xe, and combinations therefrom and the mixture of etchant gas are flown into the process chamber during the reactive ion etch.

The second anisotropic etch proceeds until the top surface of the at least one underlying layer (20, 30) is exposed in the at least one first trenches T1. Typically, the patterned photoresist layer 60' is consumed completely before the end of the second anisotropic etch. Complete consumption of the patterned photoresist layer 60' prior to the end of the second anisotropic etch is not a requirement of the present invention, and embodiment in which some of the patterned photoresist layer 60' remains at the end of the second anisotropic etch are also contemplated herein.

Figure 5:
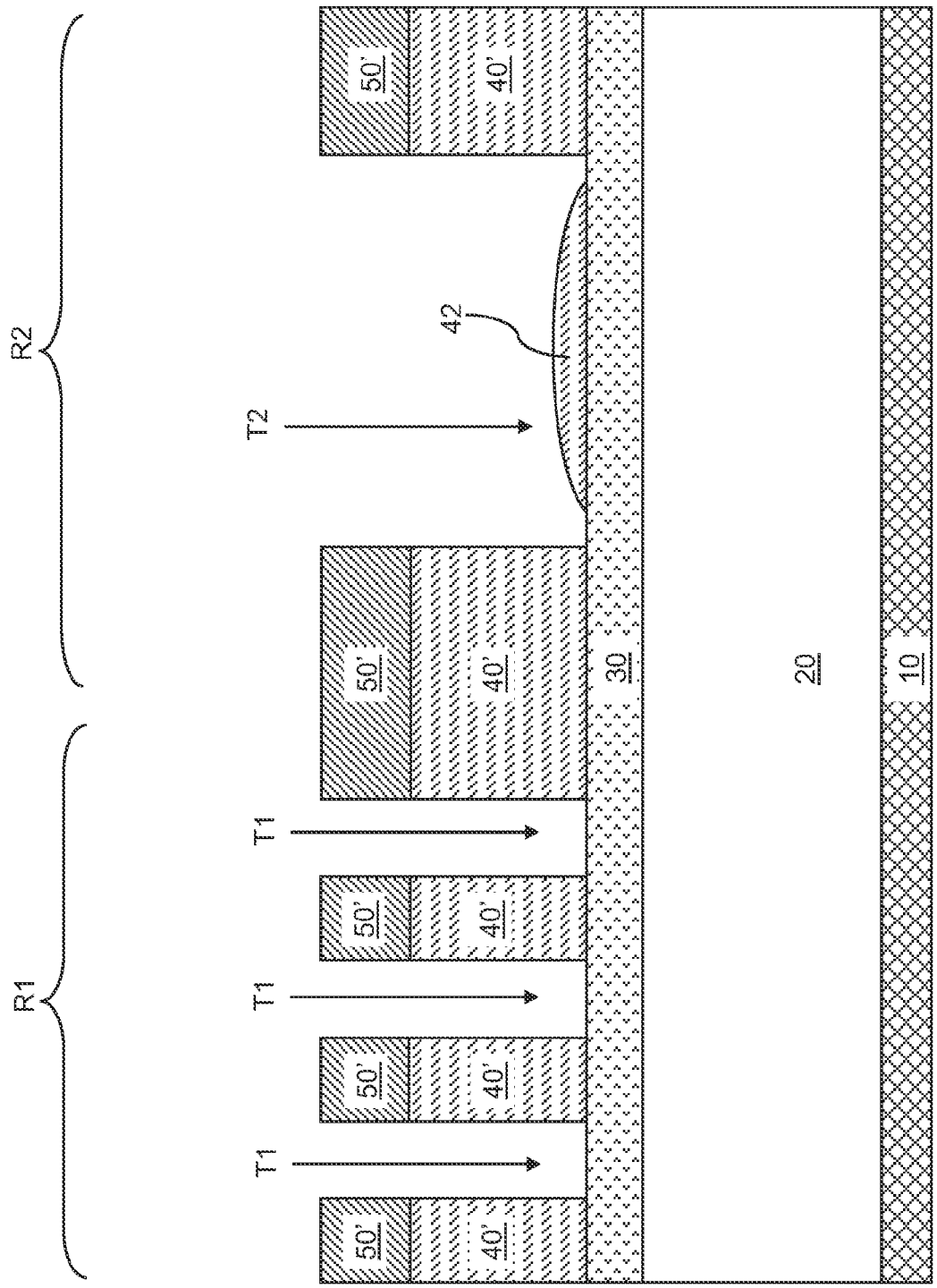
FIG. 5 is a vertical cross-sectional view of the first exemplary structure after the second anisotropic etch according to the first embodiment of the present invention.

Referring to FIG. 5, the organic planarizing layer 40 is patterned to form a patterned organic planarizing layer 40' after the pattern of the at least one first trench T1 and the second trench T2 is transferred into the organic planarizing layer 40 at the end of the second anisotropic etch. The organic planarizing material of the patterned organic planarizing layer 40' is completely removed from the at least one first trench T1, and a top surface of the at least one underlying layer (20, 30), and specifically, the top surface of the dielectric hard mask layer 30, is exposed across the entirety of the bottom surface of each of the at least one first trench T1. At the end of the second anisotropic etch, an etch residue portion 42 including the organic planarizing material is formed on the bottom surface of the second trench T2. The formation of the etch residue portion 42 is concurrent with, i.e., simultaneous with, the physical exposure of the top surface of the dielectric hard mask layer 30 within the at least one first trench T1, and occurs in the last phase of the second anisotropic etch.

At the end of the second anisotropic etch, the etch residue portion 42 covers a center portion of the bottom surface of the second trench T2. Top surface of the at least one underlying layer (20, 30), and specifically the top surface of the dielectric hard mask layer 30, is exposed on a periphery of the second trench T2 after the complete removal of the organic planarizing material from the at least one first trench T1.

Optionally, the patterned BARC layer 50' may be removed after the second anisotropic etch selective to the patterned organic planarizing layer 40', the etch residue portion 42 including the organic planarizing material, and the dielectric hard mask layer 30, for example, by ashing.

Figure 6:
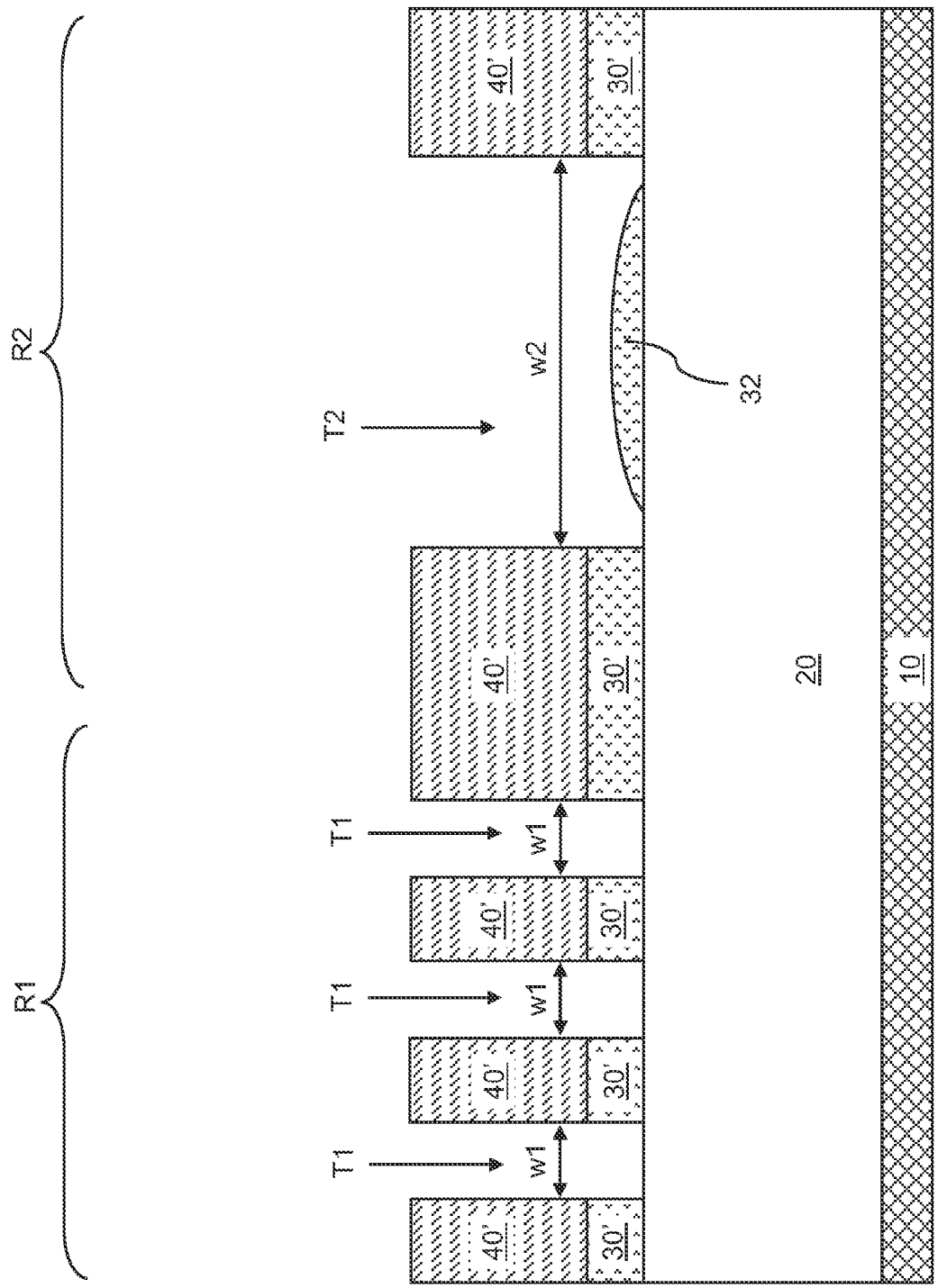
FIG. 6 is a vertical cross-sectional view of the first exemplary structure after a third anisotropic etch that etches a dielectric hard mask layer according to the first embodiment of the present invention.

Referring to FIG. 6, the pattern in the patterned organic planarizing layer 40' is transferred into the dielectric hard mask layer 30 by a third anisotropic etch that etches the dielectric hard mask layer 30 employing the patterned organic planarizing layer 40' and the etch residue portion 42 as a masking material. The third anisotropic etch is a reactive ion etch that is performed in a process chamber, which may be the same as, or different from, the process chamber employed for the second anisotropic etch. Preferably, the third anisotropic etch is performed in the same process chamber as the second anisotropic etch.

The etch residue portion 42 protects a portion of the dielectric hard mask layer 30 in an early portion of the third anisotropic etch, but is subsequently consumed before the end of the third anisotropic etch. The top surface of the material layer 20 is exposed across the entirety of the bottom surface of the at least one first trench T1 after the third anisotropic etch, i.e., the etch of the dielectric hard mask layer 30. The remaining portion of the dielectric hard mask layer 30 located underneath the patterned organic planarizing layer 40' is a patterned dielectric hard mask layer 30'. An unetched portion of the dielectric hard mask layer, which is herein referred to as a dielectric hard mask material portion 32, is present directly on a center portion of a bottom surface of the second trench T2. The dielectric hard mask material portion 32 has a convex upper surface and a planar lower surface.

In some cases, the organic planarizing layer 40' is not removed and is employed as an etch mask in a subsequent fourth anisotropic etch. In some other cases, the organic planarizing layer 40' is removed selective to the patterned dielectric hard mask layer 30', the dielectric hard mask material portion 32, and the material layer 20.

Figure 7:
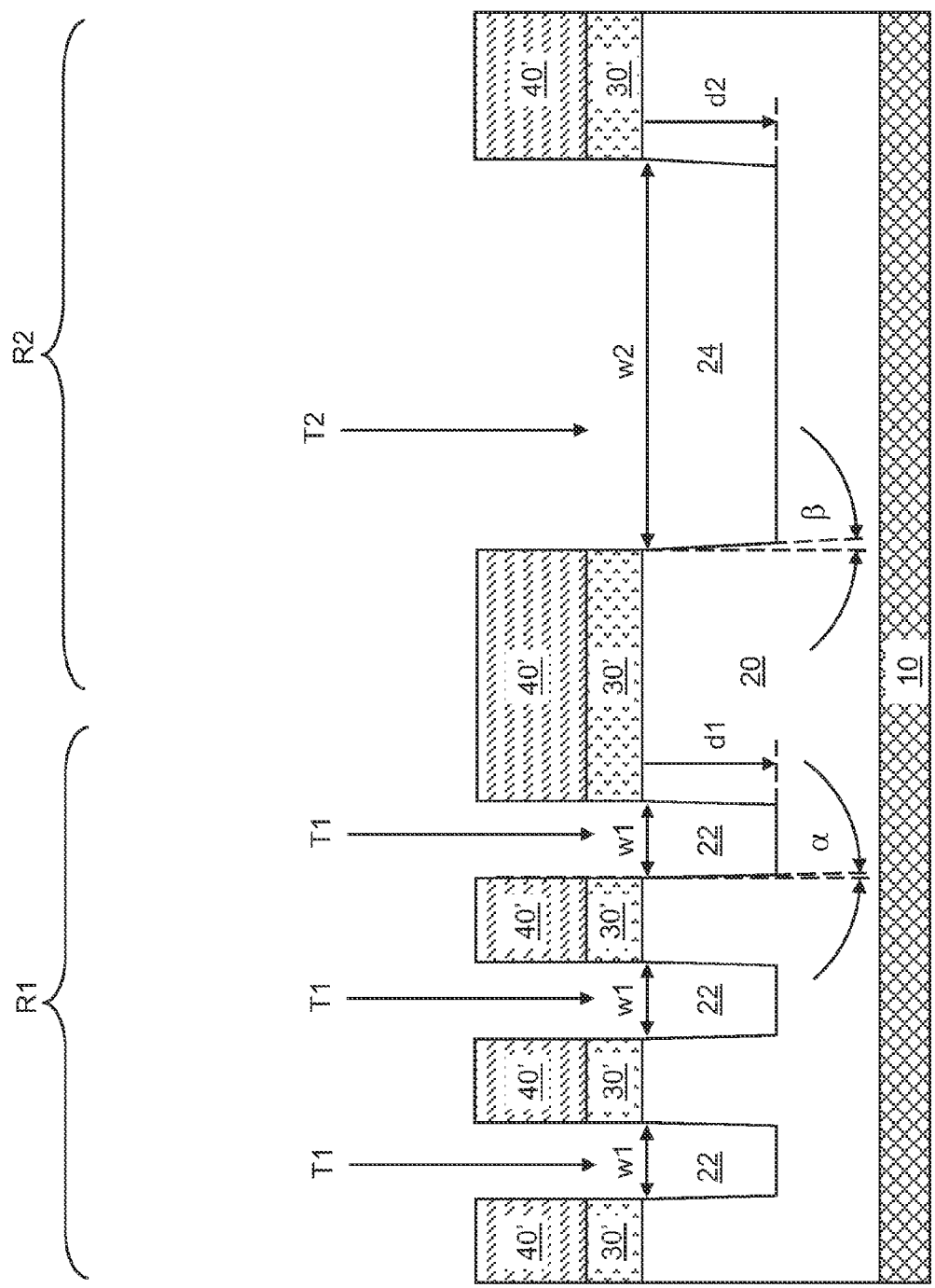
FIG. 7 is a vertical cross-sectional view of the first exemplary structure after a fourth anisotropic etch that forms trenches having different widths and the same depth in a material layer according to the first embodiment of the present invention.

Referring to FIG. 7, the pattern in the organic planarizing layer 40' is transferred into the material layer by a fourth anisotropic etch. The at least one first trench T1 and the second trench T2 are extended into the material layer 20 by the fourth anisotropic etch. The fourth anisotropic etch is a reactive ion etch that is performed in a process chamber, which may be the same as, or different from, the process chamber employed for the third anisotropic etch. Preferably, the fourth anisotropic etch is performed in the same process chamber as the third anisotropic etch.

The fourth anisotropic etch removes the dielectric material of the material layer 20 employing a reactant gas mixture including at least one fluorocarbon gas. For example, the fourth reactant gas mixture may include $C_4F_8$, Ar, and $N_2$.

Each first trench T1 includes a first-type material-layer-level trench 22, which is a sub-portion of the corresponding first trench T1 within the material layer 20. The second trench T2 includes a second-type material-layer-level trench 24, which is a sub-trench of the second trench T2 within the material layer 20.

During an earlier portion of the fourth anisotropic etch, the material layer 20 is etched in the at least one first trench T1, while the dielectric hard mask material portion 32, i.e., the unetched portion of the dielectric hard mask layer 30, is concurrently etched in the second trench T2. During a latter portion of the fourth anisotropic etch, that is, after all of the dielectric hard mask material portion 32 is removed, additional material in the material layer 20 is etched in the at least one first trench T1, while the material of the material layer 20 is etched in the second trench. During this latter portion of the fourth anisotropic etch, etching of the material layer 20 proceeds at a greater rate at a center portion of the second trench T2 than at the at least one first trench T2 due to the availability of more etchant in the second trench T2 relative to the at least one first trench T1. It is noted that without the etch-retarding effect of the dielectric hard mask material portion 32 in the earlier portion of the fourth anisotropic etch, the second trench T2 would be etch deeper than the at least one first trench T1.

Preferably, the at least one first-type material-layer-level trench 22 and the second-type material-layer-level trench 24 have a planar bottom surface. Each first-type material-layer-level trench 22 has a first depth d1, which is a vertical distance from a planar top surface of the material layer 20 to the bottom surface of the corresponding first-type material-layer-level trench 22. The width of the at least one first-type material-layer-level trench 22 as measured at the top of the corresponding first-type material-layer-level trench 22, i.e., at the plane of the interface between the material layer 20 and the patterned dielectric hard mask layer 30', is the first width w1.

The second-type material-layer-level trench 24 has a second depth d2, which is a vertical distance from the planar top surface of the material layer 20 to the bottom surface of the second-type material-layer-level trench 24. The width of the second-type material-layer-level trench 24 as measured at the top of the corresponding second-type material-layer-level trench 22, i.e., at the plane of the interface between the material layer 20 and the patterned dielectric hard mask layer 30', is the second width w2.

The presence of the dielectric hard mask material portion 32 provides less etching of the material layer 20 in the second trench T2 relative to the at least one trench T1 during the earlier portion of the fourth anisotropic etch. The faster etch rate of the material layer 30 in the latter portion of the fourth anisotropic etch relative to the at least one trench T1 is thus compensated for by the reduced etch rate during the earlier portion of the fourth anisotropic etch so that the first depth d1 and the second depth d2 are the same.

Such balancing between the overall etch rate between the at least one trench T1 and the second trench T2 has a further beneficial effect of reducing the difference in the sidewall angles of the at least one trench T1 and the second trench T2. The first sidewall angle α is defined as the angle between the surface normal of the planar top surface of the material layer 20 and a sidewall of the at least one first-type material-layer-level trench 24. The second sidewall angle is defined as the angle between the surface normal of the planar top surface of the material layer 20 and a sidewall of the second-type material-layer-level trench 24. The difference between β and a is less than a corresponding difference in prior art structures due to the overall balancing of the etch rate for the material layer 20 across the at least one trench T1 and the second trench T2. The reduction in the difference in the sidewall angle of trenches having different widths is an additional advantage that the present invention provides.

The etch chemistry for the fourth anisotropic etch may be adjusted so that the second depth d2 is the same as the first depth d1. As discussed above, however, the second width d2 is greater than the first width d1. Thus, trenches having different widths and the same depth in the material layer 20 are provided. Conductive material structures that are subsequently formed in the at least one first-type material-layer-level trench 22 and the second-type material-layer-level trench 24 have bottom surfaces that are substantially coplanar. Thus, parasitic capacitive coupling for the conductive material structure (such as a metal line) formed in the second-type material-layer-level trench 24 is reduced, and the probability of electrical shorts between the he conductive material structure formed in the second-type material-layer-level trench 24 and another conductive material structure in another layer underneath is reduced.

Subsequently, the patterned organic planarizing layer 40' and the patterned dielectric hard mask layer 30' are removed selective to the material layer 20.

Figure 8:
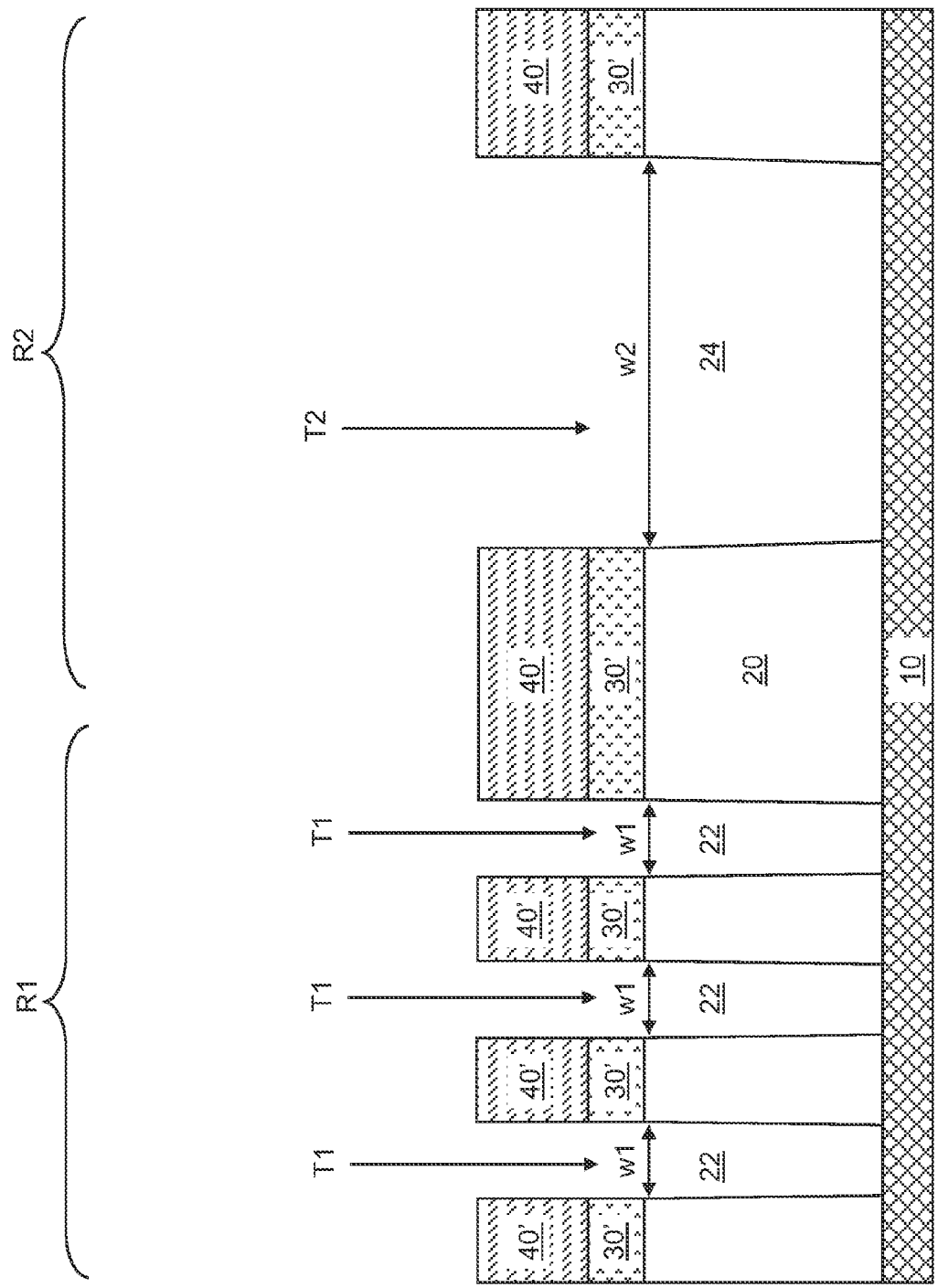
FIG. 8 is a vertical cross-sectional view of a first variation on the first exemplary structure after a fourth anisotropic etch that forms trenches that extend to a top surface of a dielectric cap layer according to a first variation of the first embodiment of the present invention.

Referring to FIG. 8, the fourth anisotropic etch may form trenches that extend to a top surface of a dielectric cap layer 10 according to a first variation of the first embodiment of the present invention. In this case, the bottom surfaces of the first-type material-layer-level trench 22 and the second-type material-layer-level trench 24 are etched at the same level so that the top surface of the dielectric cap layer 10 is exposed simultaneously within the first-type material-layer-level trench 22 and the second-type material-layer-level trench 24 at the end of the fourth anisotropic etch. Thus, overetching into the dielectric cap layer 10 is minimized due to the simultaneous exposure of the top surface of the dielectric cap layer 10 in the first-type material-layer-level trench 22 and the second-type material-layer-level trench 24. Subsequently, the patterned organic planarizing layer 40' and the patterned dielectric hard mask layer 30' are removed selective to the material layer 20 and the dielectric cap layer 10.

Figure 9:
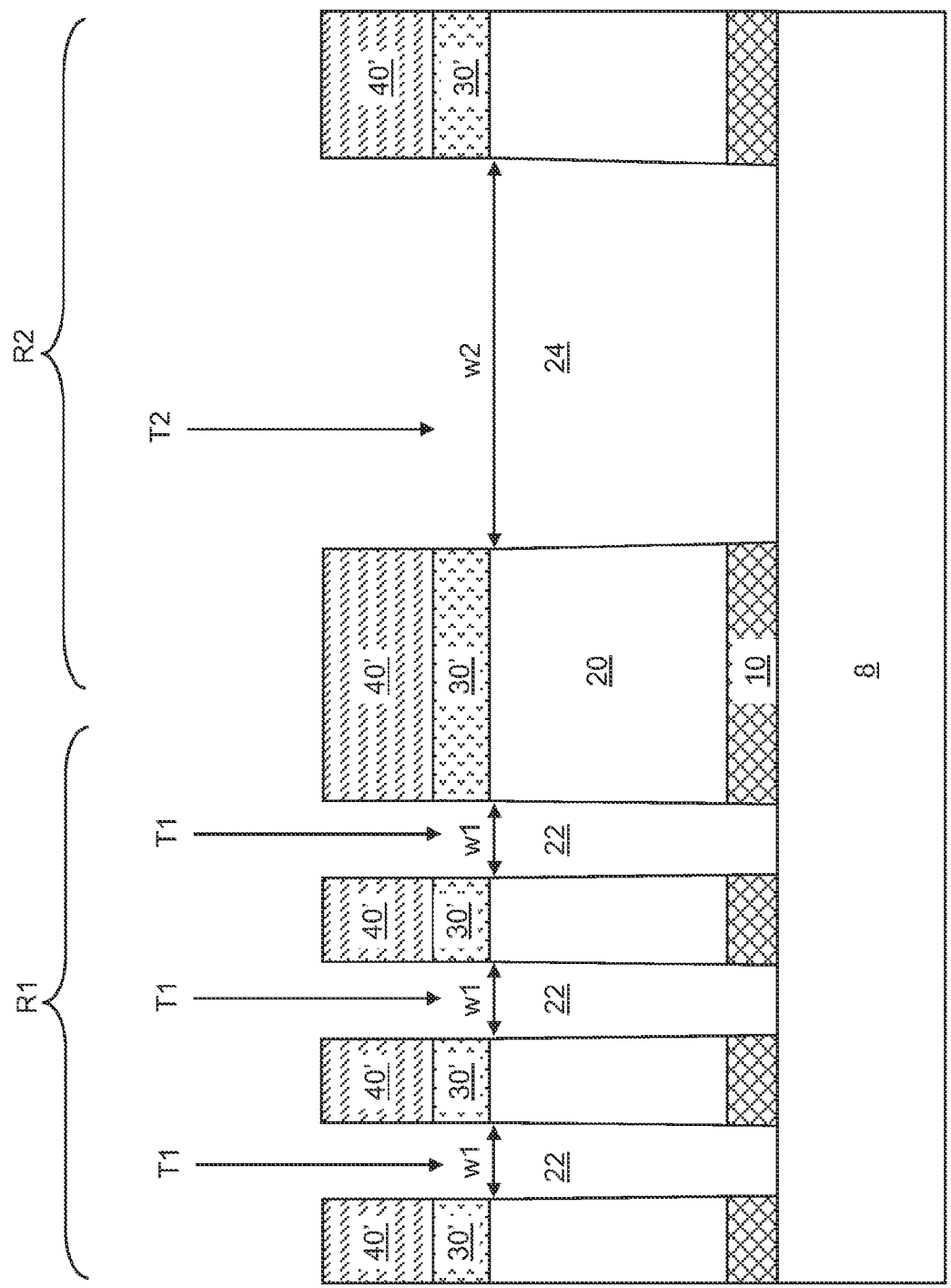
FIG. 9 is a vertical cross-sectional view of a second variation on the first exemplary structure after another anisotropic etch that etches through a dielectric cap layer and stopping on a top surface of an underlying layer according to a second variation of the first embodiment of the present invention.

Referring to FIG. 9, the fourth anisotropic etch is followed by another etch, which may be an anisotropic etch, to form trenches that extend through the dielectric cap layer 10 according to a second variation of the first embodiment of the present invention. Portions of a top surface of an underlying layer 8 located beneath the dielectric cap layer 10 is exposed. The underlying layer may be, for example, a dielectric material layer having embedded metal interconnect structures such as metal lines and metal vias.

In this case, the exposed top surface of the underlying layer 8, which is the bottom surfaces of the first-type material-layer-level trench 22 and the second-type material-layer-level trench 24, may be coplanar with the interface between the underlying layer 8 and the dielectric cap layer 10. In this case, simultaneous exposure of the top surface of the dielectric cap layer 10 at the bottom surfaces of the first-type material-layer-level trench 22 and the second-type material-layer-level trench 24 at the end of the fourth anisotropic etch allows simultaneous exposure of the top surface of the underlying layer 8. Thus, overetching into the underlying layer 8 is minimized. Subsequently, the patterned organic planarizing layer 40' and the patterned dielectric hard mask layer 30' are removed selective to the material layer 20, the dielectric cap layer 10, and the underlying layer 8.

Figure 10:
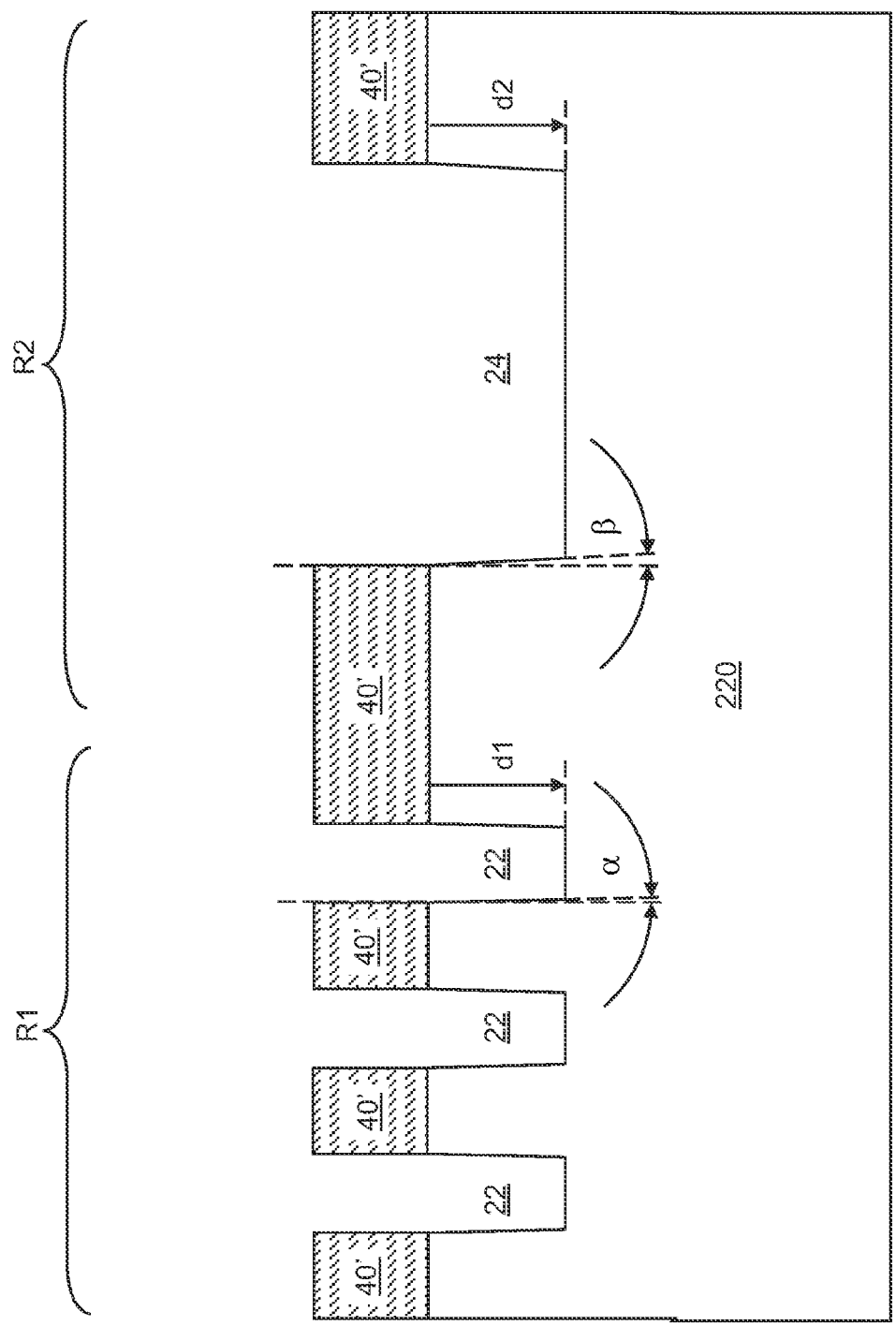
FIG. 10 is a vertical cross-sectional view of a second exemplary structure after forming trenches having different widths and the same depth in a material layer according to a second embodiment of the present invention.

One embodiment of the present invention may be practiced by employing a material layer that includes a semiconductor material. Referring to FIG. 10, a second exemplary structure that substitutes a semiconductor material layer 220 for the at least one underlying layer (20, 30), i.e., the combination of the material layer 20 and the dielectric hard mask layer 30, is shown after forming trenches having different widths and the same depth as in the first embodiment. In this case, the semiconductor layer 220 may consist essentially of an undoped semiconductor material, a doped semiconductor material, or a combination thereof. The second exemplary structure is formed by employing the same processing steps as in the first embodiment except for processing steps specific to the dielectric hard mask layer 30. The second exemplary structure may be employed to form shallow trench isolation structures having the same depth in the at least one first-type material-layer-level trench 22 and the second-type material-layer-level trench 24. Subsequently, the patterned organic planarizing layer 40' is removed selective to the semiconductor layer 220.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a patterned structure comprising:
    forming a material stack including a photoresist layer and an organic planarizing layer comprising an organic planarizing material over at least one underlying layer;
    forming a first trench in a first region of said organic planarizing layer and a second trench in a second region of said material stack by etching said organic planarizing layer, wherein two sidewalls of said first trench are separated by a first width and two sidewalls of said second trench are separated by a second width that is greater than said first width; and
    completely removing said organic planarizing material from said first trench to expose a topmost surface of said at least one underlying layer across an entirety of a bottom surface extending from one of said first sidewalls of said first trench to the other of said first sidewalls of said first trench, said entirety of said bottom surface not including a surface of any organic planarizing material after said complete removal of said organic planarizing material from said first trench, while concurrently forming an etch residue portion comprising said organic planarizing material, which is present when said entirety of said bottom surface does not include a surface of any organic planarizing material, on a center portion of a bottom surface of said second trench and above said topmost surface of said at least one underlying layer and concurrently exposing said topmost surface of said at least one underlying layer in peripheral portions of said bottom surface of said second trench.

2. The method of claim 1, further comprising extending said first trench and said second trench into a material layer within said at least one underlying layer by an anisotropic etch.

3. The method of claim 2, wherein said first trench has a first depth and said second trench has a second depth after said extending, said second depth is the same as said first depth after said extending, and said first depth is a vertical distance from a planar top surface of said material layer to a bottom surface of said first trench after said extending and said second depth is a vertical distance from said planar top surface of said material layer to a bottom surface of said second trench after said extending.

4. The method of claim 2, wherein said at least one underlying layer comprises a vertical stack including, from bottom to top, said material layer and a dielectric hard mask layer having a dielectric constant greater than 2.7.

5. The method of claim 4, further comprising forming said material layer by depositing at least one dielectric material selected from a low dielectric constant (low-k) material layer having a dielectric constant less than 2.7, a silicon oxide, a silicon nitride, a silicon oxynitride, and a doped silicate glass.

6. The method of claim 5, wherein said anisotropic etch removes said at least one dielectric material employing a reactant gas mixture including at least one fluorocarbon gas.

7. The method of claim 4, wherein further comprising forming said dielectric hard mask layer by depositing a silicon nitride layer, a silicon oxide layer, a silicon oxynitride layer, or a combination thereof.

8. The method of claim 4, further comprising anisotropically etching said material layer in said first trench, while concurrently etching an unetched portion of said dielectric hard mask layer in said second trench.

9. The method of claim 8, further comprising etching said material layer in said second trench after all of said unetched portion of said dielectric hard mask layer is removed, wherein etching of said material layer proceeds at a greater rate at a center portion of said second trench than at said first trench after removal of all of said unetched portion of said dielectric hard mask layer.

10. The method of claim 2, wherein said at least one underlying layer includes a semiconductor layer consisting essentially of an undoped semiconductor material, a doped semiconductor material, or a combination thereof.

11. The method of claim 1, wherein said at least one underlying layer includes a stack, from bottom to top, of a material layer and a dielectric hard mask layer contacting a bottom surface of said organic planarizing layer, and said method further comprises etching said dielectric hard mask layer employing at least said etch residue portion as a masking material, wherein a top surface of said material layer is exposed across an entirety of a bottom surface of said first trench after said etch of said dielectric hard mask layer, while an unetched portion of said dielectric hard mask layer is present directly on a center portion of a bottom surface of said second trench and said top surface of said material layer is exposed in peripheral portions of said second trench after said etch of said dielectric hard mask layer.

12. The method of claim 1, further comprising forming said organic planarizing layer by depositing an organic material including C, H, and N, wherein said organic planarizing layer is free of F.

13. The method of claim 1, wherein said material stack includes, from bottom to top, said organic planarizing layer, a bottom anti-reflective coating (BARC) layer, said photoresist layer, and a top anti-reflective coating (TARC) layer.

14. The method of claim 13, wherein said method further comprises lithographically patterning said photoresist layer by exposure and development.

15. The method of claim 14, wherein said lithographically patterned photoresist layer as an etch mask for said etching of said organic planarizing layer.

16. The method of claim 1, wherein said etching of said organic planarizing layer is performed using a reactive ion etch in a process chamber, wherein a mixture of etchant gas including $H_2$ that is flown at a first flow rate and $N_2$ that is flown at a second flow rate is introduced into said process chamber during said reactive ion etch, wherein said first flow rate is greater than said second flow rate.

17. The method of claim 16, wherein a ratio between said first flow rate and said second flow rate is greater than 1:1 and less than 10:1.

18. The method of claim 16, wherein said first flow rate is from 10 sccm to 2,000 sccm, and wherein a pressure in said process chamber during said reactive ion etch is from 5 mTorr to 200 mTorr.

19. The method of claim 16, wherein said etchant gas consists essentially of $H_2$ and $N_2$ and no other gas is flown into said process chamber during said reactive ion etch than said mixture of etchant gas.

20. The method of claim 16, wherein said etchant gas consists essentially of $H_2$ and $N_2$ and only an inert gas selected from He, Ne, Ar, Kr, Xe, and combinations therefrom and said mixture of etchant gas are flown into said process chamber during said reactive ion etch.

* * * * *